(12) United States Patent
Ko (10) Patent No.: US 9,263,707 B2
(45) Date of Patent: Feb. 16, 2016

(54) MASK ASSEMBLY AND METHOD OF FABRICATING ORGANIC LIGHT EMITTING DISPLAY DEVICE USING THE SAME

(71) Applicant: Samsung Display Co., Ltd., Gyeonggi-do (KR)

(72) Inventor: Jung Woo Ko, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/247,557

(22) Filed: Apr. 8, 2014

(65) Prior Publication Data

US 2015/0011033 A1    Jan. 8, 2015

(30) Foreign Application Priority Data

Jul. 8, 2013  (KR) ................. 10-2013-0079788

(51) Int. Cl.
| | |
|---|---|
| *H01L 21/00* | (2006.01) |
| *H01L 51/56* | (2006.01) |
| *B05C 21/00* | (2006.01) |
| *C23C 14/04* | (2006.01) |
| *H01L 51/00* | (2006.01) |

(52) U.S. Cl.
CPC .............. *H01L 51/56* (2013.01); *B05C 21/005* (2013.01); *C23C 14/042* (2013.01); *H01L 51/0011* (2013.01)

(58) Field of Classification Search
CPC .......................... H01L 51/0018; B05C 21/005
USPC ...................................... 438/697, 42; 118/504
See application file for complete search history.

(56) References Cited

U.S. PATENT DOCUMENTS

| | | | | |
|---|---|---|---|---|
| 2002/0025406 A1* | 2/2002 | Kitazume | ............... | 428/136 |
| 2004/0003775 A1* | 1/2004 | Kim | ............... | 118/504 |
| 2005/0109273 A1* | 5/2005 | Kim | ............... | 118/504 |
| 2006/0024444 A1* | 2/2006 | Brody | ............... | 427/282 |

FOREIGN PATENT DOCUMENTS

| | | |
|---|---|---|
| KR | 10-2003-0002947 A | 1/2003 |
| KR | 10-2006-0055097 A | 5/2006 |
| KR | 10-2011-0068174 A | 6/2011 |

* cited by examiner

*Primary Examiner* — Caridad Everhart
(74) *Attorney, Agent, or Firm* — Lee & Morse, P.C.

(57) ABSTRACT

A mask assembly and a method of fabricating an organic light emitting display device using the same are provided. The mask assembly includes: a mask frame including a window therein; and a mask which is disposed on the window and fixed to the mask frame, wherein the mask includes a plurality of open parts and a plurality of blocked parts which extend in a column direction. Each open part and each blocked part may alternately be arranged in a row direction. Each open part may include a plurality of pixel openings and a plurality of pixel connection openings, which are alternately arranged in the column direction, and a maximum width of the pixel opening may be larger than a maximum width of the pixel connection opening.

19 Claims, 9 Drawing Sheets

MASK ASSEMBLY AND METHOD OF FABRICATING ORGANIC LIGHT EMITTING DISPLAY DEVICE USING THE SAME

CROSS-REFERENCE TO RELATED APPLICATION

The present application claims priority under 35 U.S.C. §119 to Korean Patent Application No. 10-2013-0079788, filed on Jul. 8, 2013, in the Korean Intellectual Property Office, and entitled: "Mask Assembly and Method of Fabricating Organic Light Emitting Display Device Using the Same," which is incorporated by reference herein in its entirety.

BACKGROUND

1. Field

Some embodiments relate to a mask assembly and a method of fabricating an organic light emitting display device using the same.

2. Description of the Related Art

Among display devices, an organic light emitting display device is a self-emitting display device that has drawn attention as a next generation display device due to a wide viewing angle, excellent contrast, and a rapid response speed.

Such an organic light emitting display device may include an intermediate layer which includes at least a light emitting layer between opposing electrodes. The electrodes and the intermediate layer may be formed by several methods. One such method is a deposition method.

In order to fabricate an organic light emitting display device using a deposition method, a mask having a pattern of an openings corresponding to a pattern of a thin film which will be formed on a substrate, for example, a fine metal mask (FMM), may be closely attached onto the substrate, and a deposition material may be deposited onto the substrate through the mask to form a thin film having a desired pattern.

SUMMARY

Embodiments are directed to a mask assembly, including a mask frame having a window; and a mask on the window and fixed to the mask frame, wherein the mask includes a plurality of open parts and a plurality of blocked parts, each extending in a column direction. Each open part and each blocked part are alternately arranged in a row direction, each open part including a plurality of pixel openings and a plurality of pixel connection openings which are alternately arranged in the column direction. A maximum width of the pixel opening is larger than a maximum width of the pixel connection opening.

The plurality of open parts includes a first open part and a second open part, the second open part being at one side of the first open part. The pixel opening of the first open part and the pixel opening of the second open part are arranged in a first row, and the pixel connection opening of the first open part and the pixel connection opening of the second open part are arranged in a second row.

Each blocked part includes a plurality of first blocked regions and a plurality of second blocked regions which are alternately arranged in the column direction. A first maximum width of each of the first blocked regions is smaller than a second maximum width of each of the second blocked regions.

The plurality of blocked parts includes a first blocked part and a second blocked part, the second blocked part being at one side of the first blocked part. The first blocked regions of the first blocked part and the first blocked regions of the second blocked part are arranged in a first row, and the second blocked regions of the first blocked part and the second blocked regions of the second blocked part are arranged in a second row.

The pixel opening and the first blocked regions are arranged in a first row, and the pixel connection opening and the second blocked regions are arranged in a second row. The pixel openings that are adjacent to each other in the column direction may be symmetric to each other with respect to the pixel connection opening between adjacent pixel openings. The pixel opening may have a dot shape and the pixel connection opening has a slit shape.

Embodiments may also be realized by providing a method of fabricating an organic light emitting display device, including preparing a mask with a plurality of open parts and a plurality of blocked parts which extend in a column direction. Each open part and each blocked part are alternately arranged in a row direction. Each open part includes a plurality of pixel openings and a plurality of pixel connection openings alternately arranged in the column direction. A maximum width of the pixel opening is larger than a maximum width of the pixel connection opening. The method may include fixing the mask on a mask frame including a window; and holding a substrate on the mask and depositing a deposition material onto the substrate through the mask.

The mask preparing step includes forming the mask such that the plurality of open parts includes a first open part and a second open part, the second open part being arranged at one side of the first open part. The pixel opening of the first open part and the pixel opening of the second open part are arranged in a first row, and the pixel connection opening of the first open part and the pixel connection opening of the second open part are arranged in a second row.

The mask preparing step may also include forming the mask such that each blocked part includes a plurality of first blocked regions and a plurality of second blocked regions alternately arranged in the column direction. A first maximum width of each of the first blocked regions is smaller than a second maximum width of each of the second blocked regions.

The mask preparing step may further include forming the mask such that the plurality of blocked parts includes a first blocked part and a second blocked part, the second blocked part being at one side of the first blocked part. The first blocked regions of the first blocked part and the first blocked regions of the second blocked part are arranged in a first row, and the second blocked regions of the first blocked part and the second blocked regions of the second blocked part are arranged in a second row.

The mask preparing step may include forming the mask such that the pixel opening and the first blocked regions are arranged in a first row, and the pixel connection opening and the second blocked regions are arranged in a second row. The mask preparing step may also include forming the mask such that the pixel openings that are adjacent to each other in the column direction are symmetric with each other with respect to the pixel connection opening between adjacent pixel openings. The mask may be formed such that the pixel opening has a dot shape and the pixel connection opening has a slit shape. The mask may also be formed such that the pixel openings that are adjacent to each other in the column direction are symmetric with each other with respect to the pixel connection opening between adjacent pixel openings.

The depositing step includes preparing the substrate for the organic light emitting display device, wherein the substrate includes a first electrode formed on the substrate for every pixel, and a pixel definition layer including an open part on the substrate to expose the first electrode. The organic light emitting layer may be formed by depositing an organic deposition material onto the first electrode in the open part of the pixel definition layer through the mask. The depositing step may also include supplying the deposition material onto the substrate by depositing the deposition material along the row direction of the mask.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present embodiments.

Hereinafter, embodiments will be described with reference to the drawings.

Figure 1:
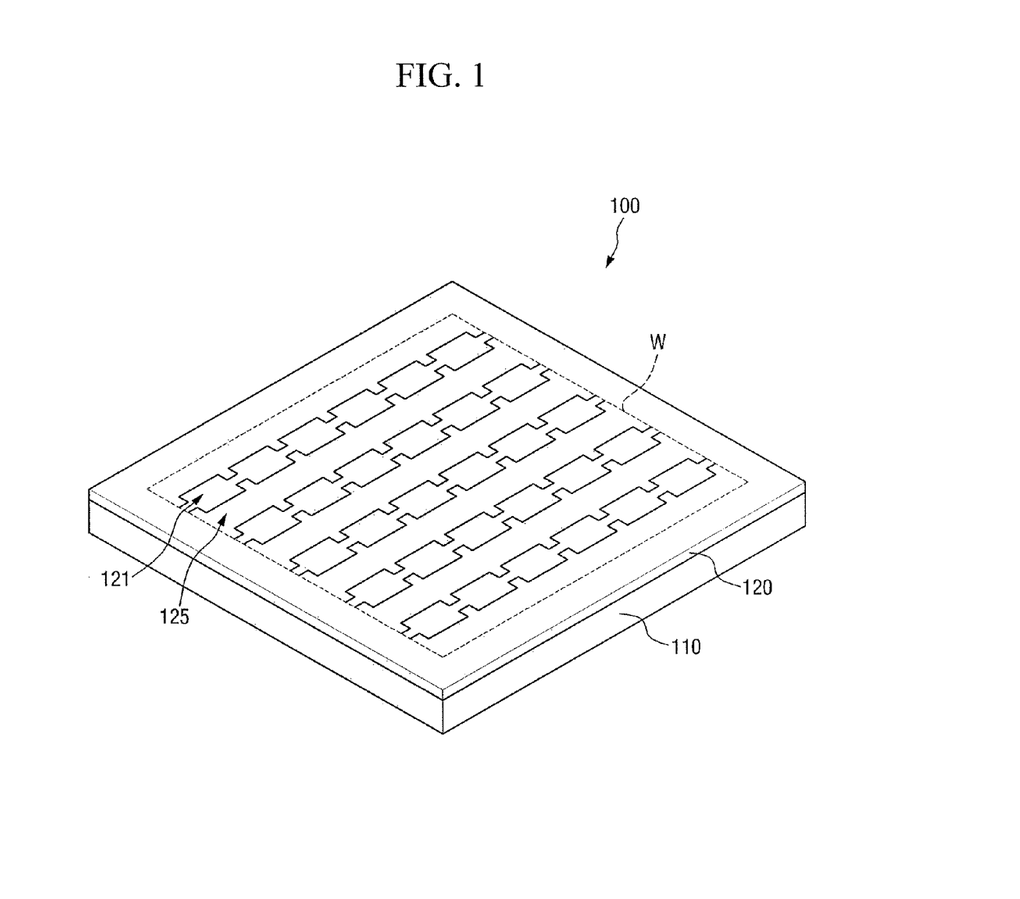
FIG. 1 illustrates a perspective view of a mask assembly according to an embodiment.

FIG. 1 illustrates a perspective view of a mask assembly according to one embodiment.

Referring to FIG. 1, a mask assembly 100 may include a mask frame 110 and a mask 120.

The mask assembly 100 may be used to deposit a deposition material on a desired position of a substrate to form a pattern of a thin film. The substrate may be a substrate for a display device. For example, the substrate may be a substrate for a display device such as an organic light emitting display device, a liquid crystal display, or a plasma display device. The substrate may be a bare substrate or a substrate on which a structure, such as a part of a thin film or a wiring line, is formed. Further, the substrate may be a substrate for a single display device or a mother board including a plurality of unit cells which is later cut to obtain a display substrate as a unit cell.

The mask frame 110 supports the mask 120 and may be formed of a rigid metal material, for example, a metal such as stainless steel. The mask frame 110 may be coupled to the mask 120 by a welding process such as a spot welding process or a laser welding process. The mask frame 110 may have a structure which does not interfere in the deposition process when depositing a deposition material on the substrate through the mask 120. For example, the mask frame 110 may have a stripe shape in which a window W is defined therein.

The mask 120 may include a plurality of open parts 121 and a plurality of blocked parts 125 and may be fixed to the mask frame 110 such that the plurality of open parts 121 are arranged to correspond to the window W of the mask frame 110.

The plurality of open parts 121 provides a path through which the deposition material may be provided onto the substrate, which is disposed on an upper portion of the mask 120, and the plurality of open parts 121 may be formed to have a pattern which corresponds to a pattern of a thin film in a position corresponding to a pattern of the thin film to be formed by depositing the deposition material on the substrate. For example, when a green organic light emitting layer among a red organic light emitting layer, a green organic light emitting layer, and a blue organic light emitting layer of the organic light emitting display device is formed on the substrate, the plurality of open parts 121 may be formed to have a pattern corresponding to a pattern of the thin film to be formed by depositing the deposition material on the substrate in a position corresponding to a pattern of the green organic light emitting layer. The mask 120 may be formed of a metal thin film such as nickel (Ni), a nickel alloy, or a nickel-cobalt alloy.

The plurality of open parts 121 is configured so as not to be separated from each other on the mask 120, but is not limited thereto. That is, the mask 120 may be include a plurality of mask stripes (or separation masks) such that the plurality of open parts 121 are separated along a predetermined direction.

The plurality of open parts 121 may be formed as a unit cell in one substrate so as to correspond to one flat panel display device (for example, an organic light emitting display device) or formed as a plurality of unit cells in one mother substrate (mother board) so as to correspond to a plurality of flat panel display devices.

The plurality of blocked parts 125 block the deposition material from being provided into an undesired region of the substrate and may define the plurality of open parts 121.

Hereinafter, the plurality of open parts 121 and the plurality of blocked parts 125 of the mask 120 will be described in detail.

Figure 2:
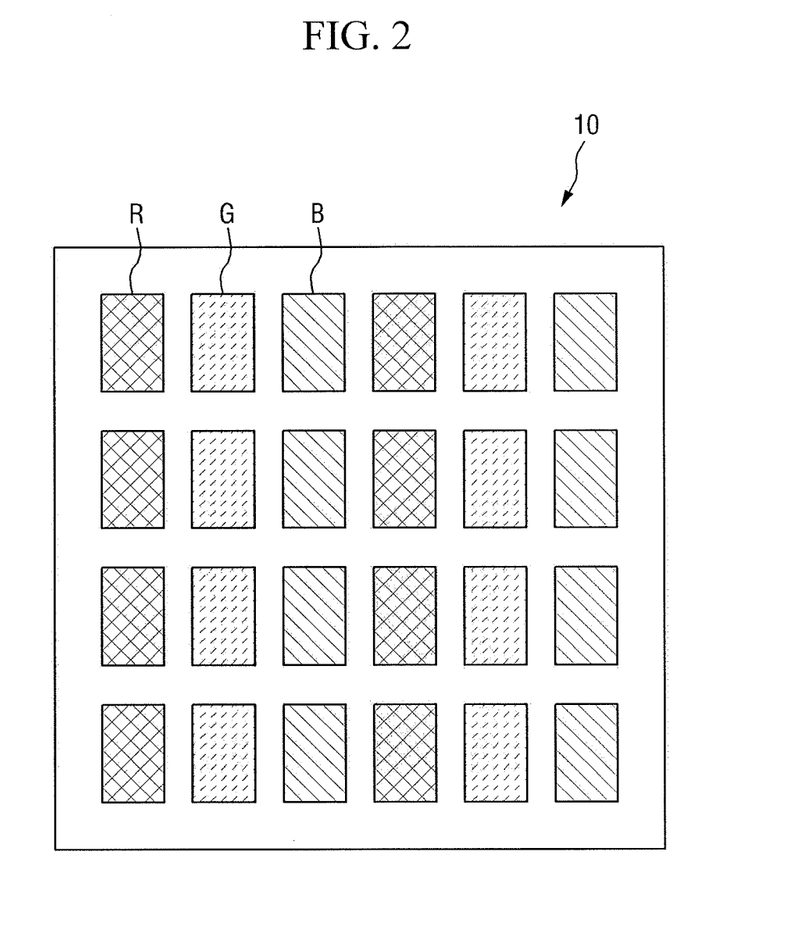
FIG. 2 illustrates a diagram illustrating an example of a pixel arrangement of an organic light emitting display device.
Figure 3:
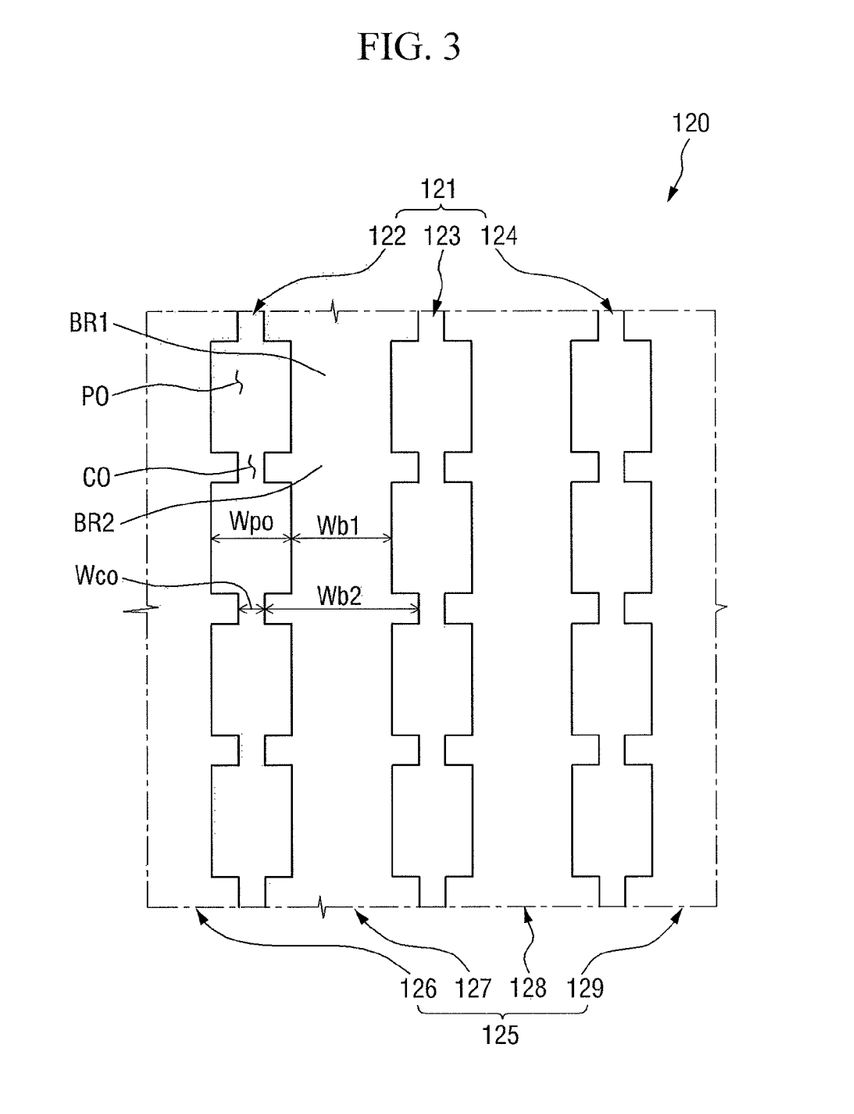
FIG. 3 illustrates a plan view illustrating a shape of a mask in detail which is used to form the pixel arrangement of the organic light emitting display device of FIG. 2.

FIG. 2 illustrates a diagram illustrating an example of a pixel arrangement of an organic light emitting display device, and FIG. 3 is a plan view illustrating a shape of a mask in detail which is used to form the pixel arrangement of the organic light emitting display device of FIG. 2.

FIG. 2 illustrates that the organic light emitting display device 10 has a stripe shaped pixel structure in which red pixels R, green pixels G, and blue pixels B are alternately arranged in a row direction. The red pixel R emits a red light, the green pixel G emits a green light, and the blue pixel B emits a blue light. Each pixel may include a thin film transistor and an organic light emitting diode. The organic light emitting diode may include a first electrode, an organic light emitting layer, and a second electrode. The organic light emitting layer may include a hole injection layer, a hole transfer layer, a light emitting layer, an electron transfer layer, and an electron injection layer. The organic light emitting display device 10 with the above-described configuration may emit light to display an image when voltages are applied to the first electrode and the second electrode such that a current flows through the organic light emitting layer. One red pixel R, one green pixel G, and one blue pixel B may form a unit pixel.

FIG. 3 illustrates a shape of the mask 120 which is used to form an organic light emitting layer for the green pixel G among the red pixel R, the green pixel G, and the blue pixel B of the organic light emitting display device 10 of FIG. 2.

Specifically, the mask 120 may include a plurality of open parts 121 and a plurality of blocked parts 125 which extend in a column direction. The plurality of open parts 121 may include a first open part 122, a second open part 123, and a third open part 124. The plurality of blocked parts 125 may include a first blocked part 126, a second blocked part 127, a third blocked part 128, and a fourth blocked part 129.

In FIG. 3, there are three open parts 121 and four blocked parts 125, but the number of the plurality of open parts 121 and the number of the plurality of blocked parts 125 are not limited. Each of the open parts 122 to 124 and each of the blocked parts 126 to 129 are alternately arranged in a row direction.

Each of open parts 122 to 124 may include a plurality of pixel openings PO and a plurality of pixel connection openings CO which are alternately arranged in the column direction. As an example, the arrangement of the open parts 122 to 124 will be described with the first open part 122 and the second open part 123 (which is disposed at one side of the first open part 122). The pixel opening PO of the first open part 122 and the pixel opening PO of the second open part 123 may be arranged in a first row and the pixel connection opening CO of the first open part 122 and the pixel connection opening CO of the second open part 123 may be arranged in a second row.

Each pixel opening PO may be formed to correspond to a shape of the organic light emitting layer at a position corresponding to the position of the organic light emitting layer to be formed in the green pixel G, and each pixel opening PO may provide a path through which an organic material for the organic light emitting layer may be deposited onto the substrate through the mask 120 to form the organic light emitting layer in the green pixel G of the substrate. Each pixel opening PO may be formed to have a dot-type shape.

Each pixel connection opening CO may be formed between adjacent pixel openings PO and the organic material may be deposited onto the green pixel G of the substrate through each pixel opening PO so that when the organic light emitting layer is formed, a path through which the organic material is deposited onto the green pixel G of the substrate corresponding to each pixel opening PO may be provided. Thus, when the organic material is deposited onto the green pixel G of the substrate through each pixel opening PO to form an organic light emitting layer, a shadow phenomenon occurring when the organic material is not sufficiently deposited at the edge of the organic light emitting layer to be formed in the green pixel G may be prevented. Each pixel connection opening CO may have a slit shape.

A maximum width Wpo of each pixel opening PO may be larger than a maximum width Wco of each pixel connection opening CO. As described above, the maximum width Wpo of each pixel opening PO may be larger than the maximum width Wco of each pixel connection opening CO so that even though the ribs of the mask (that is, the regions of the blocked parts 125 positioned at either side of each pixel connection opening CO) are attached to each other with respect to each pixel connection opening CO during the deposition process, each pixel opening PO which is formed to have a pattern corresponding to the pattern of a thin film to be formed substantially on the substrate may be minutely reduced but does not largely affect the formation of the pattern of the thin film to be formed on the substrate. Further, the pixel openings PO which are adjacent to each other in the column direction may be symmetric with each other with respect to the adjacent pixel connection openings CO.

Each pixel connection opening CO may be formed along a direction intersecting a moving direction of a deposition supply source which may supply an organic material for the organic light emitting layer. Accordingly, when the organic material is deposited onto the green pixel G of the substrate through each pixel opening PO to form the organic light emitting layer, a shadow phenomenon may be reduced or prevented. The shadow phenomenon may be occur when the organic material does not fully reach an edge of the organic light emitting layer oriented in a direction intersecting the moving direction of the deposition supply source.

Each of the blocked parts 126 to 129 may include a plurality of first blocked regions BR1 and a plurality of second blocked region BR2 which are alternately arranged in the column direction.

The arrangement of the blocked parts 126 to 129 will be described with the second blocked part 127 and the third blocked part 128 which is disposed at one side of the second blocked part 127 as examples. The first blocked region BR1 of the second blocked part 127 and the first blocked region BR1 of the third blocked part 128 may be arranged in a first row, and the second blocked region BR2 of the second blocked part 127 and the second blocked region BR2 of the third blocked part 128 may be arranged in a second row. Here, a maximum width Wb1 of the first blocked region BR1 may be smaller than a maximum width Wb2 of the second blocked region BR2.

The arrangements of each open part 122 to 124 and each blocked part 126 to 129 will be described. The pixel opening PO of each of the open parts 122 to 124 and the first blocked region BR1 of each of the blocked parts 126 to 129 may be arranged in a first row, and the pixel connection opening CO of each of the open parts 122 to 124 and the second blocked region BR2 of each of the blocked parts 126 to 129 may be arranged in a second row.

Next, another example of the pixel arrangement of the organic light emitting display device and the formation of the mask that may be used to form the pixel arrangement of the organic light emitting display device will be described.

Figure 4:
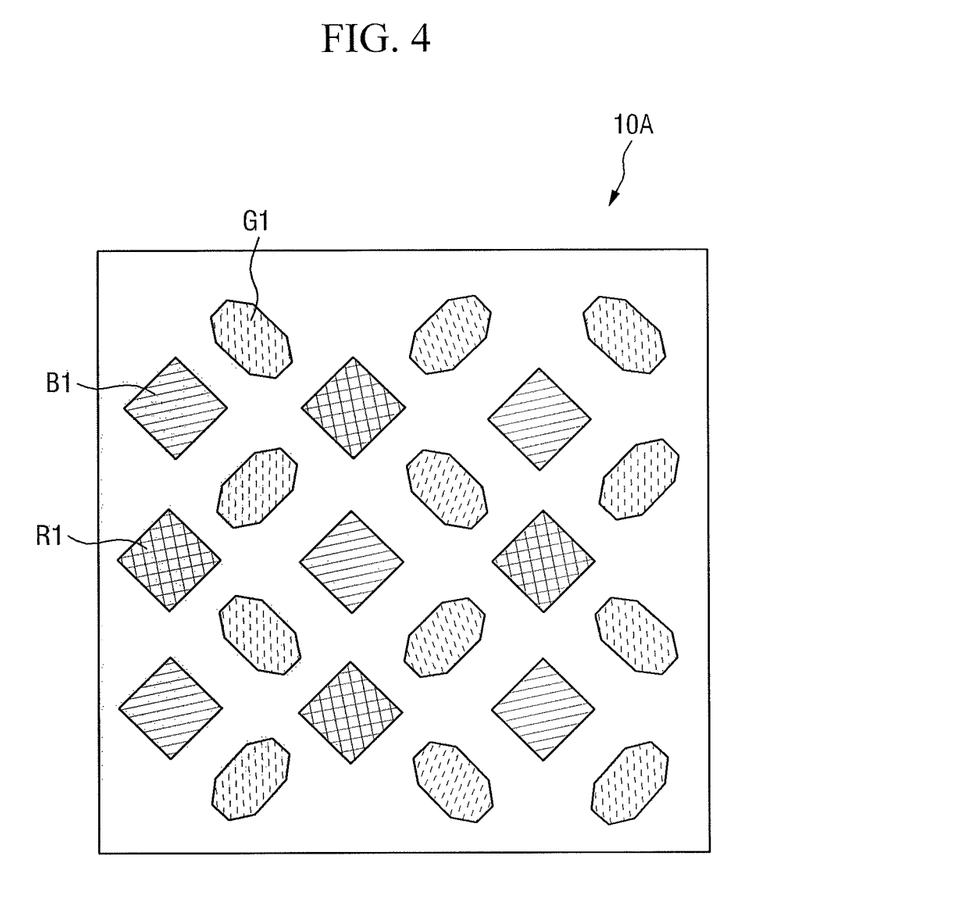
FIG. 4 illustrates a diagram illustrating another example of the pixel arrangement of the organic light emitting display device.
Figure 5:
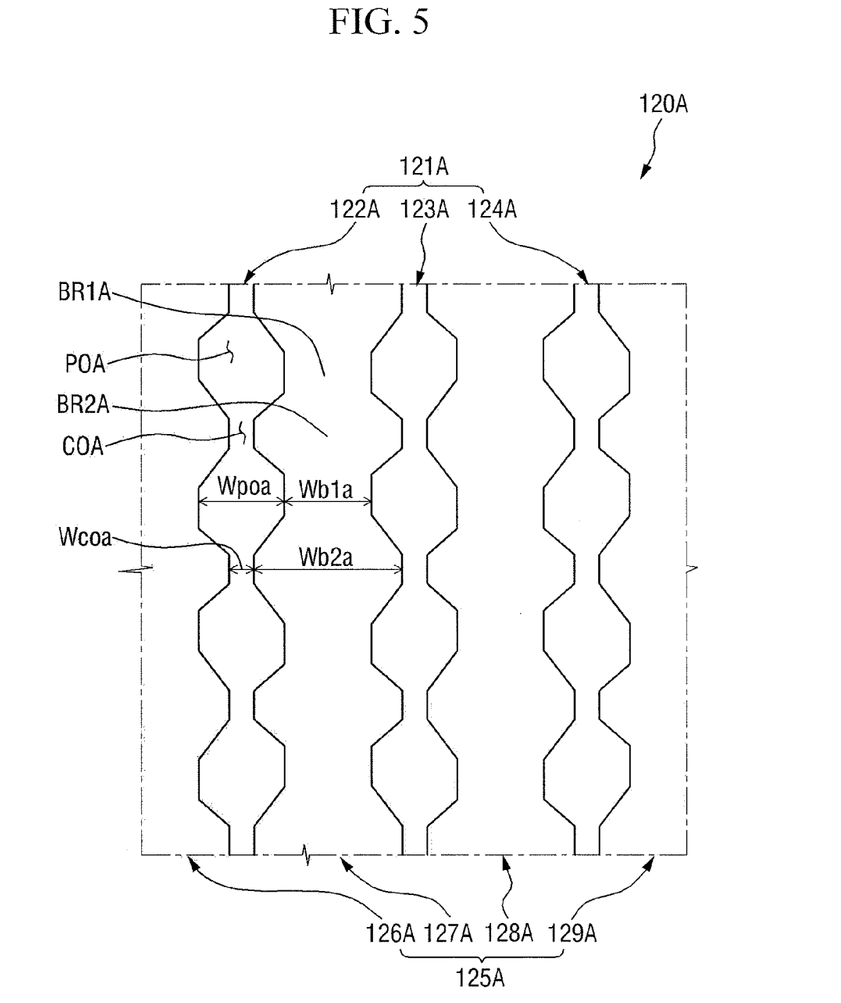
FIG. 5 illustrates a plan view illustrating a shape of a mask in detail which is used to form the pixel arrangement of the organic light emitting display device of FIG. 4.

FIG. 4 illustrates a diagram illustrating another example of the pixel arrangement of the organic light emitting display device and FIG. 5 is a plan view illustrating a shape of the mask which may be used to form the pixel arrangement of the organic light emitting display device of FIG. 4.

FIG. 4 illustrates an organic light emitting display device 10A including a pentile pixel structure. That is, the organic light emitting display device 10A may include a pixel structure in which a red pixel R1 and a blue pixel B1 are alternately arranged in the same first column, and a green pixel G1 is arranged in a second column, the second column being adjacent to the first column. Such a pentile pixel arrangement may result in a high aperture ratio by decreasing the number of red pixels R1 and blue pixels B1 to half of the stripe pixel arrangement.

FIG. 5 illustrates a shape of mask 120A which may be used to form an organic light emitting layer for the green pixel G1 among the red pixel R1, the green pixel G1, and the blue pixel B1 of the organic light emitting display device 10A of FIG. 4.

The mask 120A may include a plurality of open parts 121A and a plurality of blocked parts 125A which extend in a column direction. The plurality of open parts 121A may include a first open part 122A, a second open part 123A, and a third open part 124A. The plurality of blocked parts 125A may include a first blocked part 126A, a second blocked part 127A, a third blocked part 128A, and a fourth blocked part 129A. Each open part 122A to 124A and each blocked part 126A to 129A may be alternately arranged in a row direction. Each open part 122A to 124A may include a plurality of pixel openings POA and a plurality of pixel connection openings COA which are alternately arranged in the column direction. A maximum width Wpoa of each pixel opening POA may be larger than a maximum width Wcoa of each pixel connection opening COA. Further, the pixel openings POA which are adjacent to each other in the column direction may be symmetric with each other with respect to the adjacent pixel connection openings COA. Each pixel connection opening COA may be arranged along a direction intersecting a moving direction of a deposition supply source which supplies an organic material for the organic light emitting layer. A maximum width Wb1a of each first blocked region BR1A may be smaller than a maximum width Wb2a of each second blocked region BR2A.

Mask 120A may have the same function as mask 120 of FIG. 3; however, mask 120A is different from the mask 120 of FIG. 3 in that the pixel opening POA may have an octagonal shape. Therefore, a description of the function of the mask 120A will be omitted.

The mask assembly 100 according to some embodiments may include the mask 120 including the plurality of open parts 121, and each of the open parts may include a plurality of pixel openings PO and a plurality of pixel connection openings CO alternately arranged in the column direction. Therefore, when the organic material is deposited onto the pixel of the substrate through the pixel opening PO to form the organic light emitting layer, a path through which the organic material may be deposited onto the pixel of the substrate corresponding to each pixel opening PO through the pixel connection opening CO may also be provided.

In the mask assembly 100 according to some embodiments, when the organic material is deposited onto the pixel of the substrate through each pixel opening PO to form an organic light emitting layer, a shadow phenomenon occurring when the organic material is not sufficiently deposited at the edge of the organic light emitting layer formed in the pixel may be prevented. Thus, errors in thin film deposition on the substrate may be prevented from occurring.

Next, a method of fabricating an organic light emitting display device using a mask assembly 100 according to some embodiments will be described.

Figure 6:
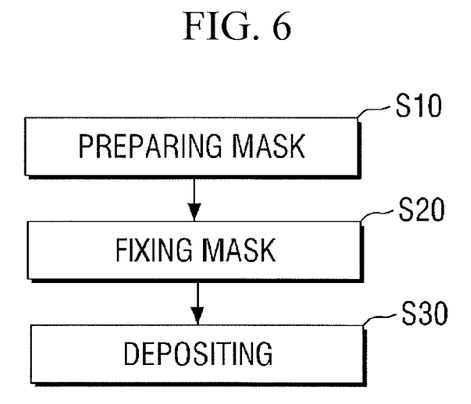
FIG. 6 illustrates a flowchart illustrating a method of fabricating an organic light emitting display device using the mask assembly according to an embodiment.

FIG. 6 illustrates a flowchart illustrating a method of fabricating an organic light emitting display device using the mask assembly according to some embodiments, and FIGS. 7 to 10 illustrate diagrams illustrating a method of fabricating an organic light emitting display device using the mask assembly of FIG. 6.

Referring to FIG. 6, the method of fabricating an organic light emitting display device using the mask assembly 100 according to some embodiments may include a mask preparing step S10, a mask fixing step S20, and a depositing step S30.

Figure 7:
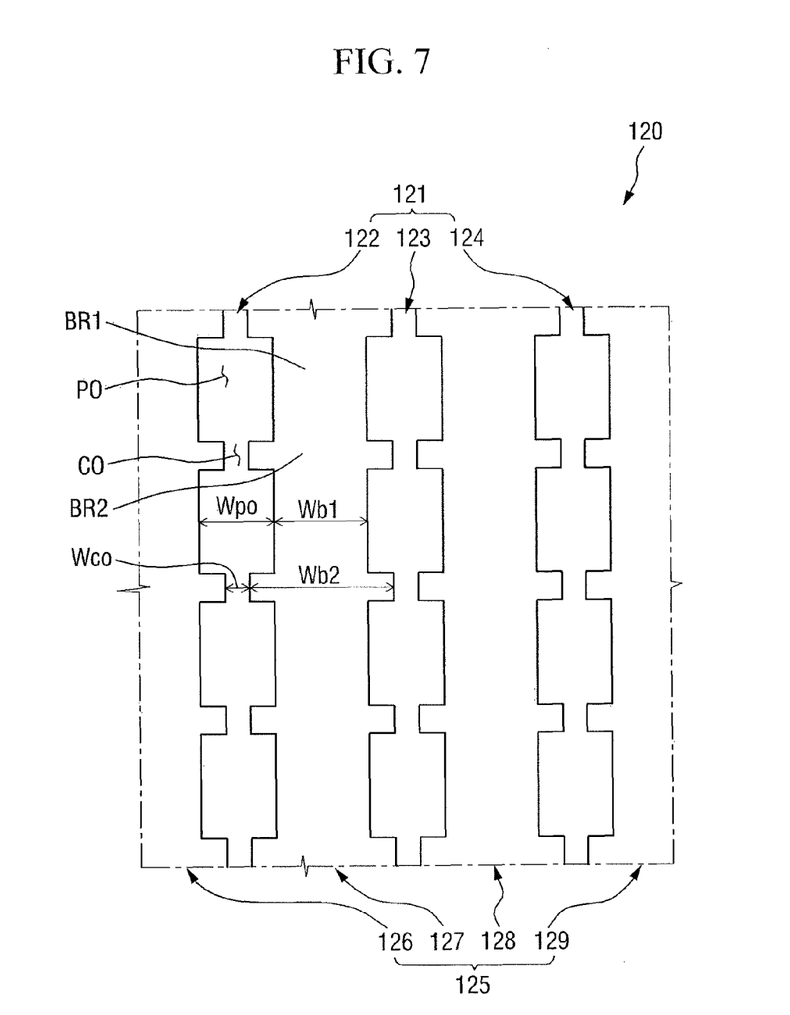
FIGS. 7 to 10 illustrate diagrams illustrating a method of fabricating an organic light emitting display device using the mask assembly of FIG. 6.

Referring to FIG. 7, in the mask preparing step S10, a mask 120 may be prepared. The mask 120 may include a plurality of open parts 121 and a plurality of blocked part 125, which extend in the column direction. Each open part 122 to 124 and each blocked part 126 to 129 may be alternately arranged in the row direction, and each open part 122 to 124 may includes a plurality of pixel openings PO and a plurality of pixel connection openings CO, which are alternately arranged in the column direction. Further, a maximum width Wpo of the pixel opening PO may be larger than a maximum width Wco of the pixel connection opening CO.

The mask preparing step S10 includes forming the mask 120 such that the plurality of open parts 121 includes a first open part 122 and a second open part 123 which may be formed at one side of the first open part 122. The pixel opening PO of the first open part 122 and the pixel opening PO of the second open part 123 may be arranged in a first row, and the pixel connection opening CO of the first open part 122 and the pixel connection opening CO of the second open part 123 may be arranged in a second row.

The mask preparing step S10 may include forming the mask 120 such that each blocked part 126 to 129 includes a plurality of first blocked regions BR1 and a plurality of second blocked regions BR2 which are alternately arranged in the column direction, and a first maximum width Wbr1 of the first blocked region BR1 may be smaller than a second maximum width Wbr2 of the second blocked region BR2.

The mask preparing step S10 may include forming a mask 120 such that the plurality of blocked parts 125 includes the second blocked part 127, and the third blocked part 128 may be disposed at one side of the second blocked part 127. The first blocked region BR1 of the second blocked part 127 and the first blocked region BR1 of the third blocked part 128 may form a first row, and the second blocked region BR2 of the second blocked part 127 and the second blocked region BR2 of the third blocked part 128 form a second row.

The mask preparing step S10 may include forming the mask 120 such that the pixel opening PO of each open part 122 to 124 and the first blocked region BR1 of each blocked part 126 to 129 are arranged in a first row, and the pixel connection opening CO of each open part 122 to 124 and the second blocked region BR2 of each blocked part 126 to 129 are arranged in a second row.

The mask preparing step S10 may include forming the mask 120 such that the pixel openings PO which are adjacent to each other in the column direction are symmetric with each other with respect to the pixel connection opening CO between adjacent pixel openings PO.

The mask preparing step S10 may include forming the mask 120 such that the pixel opening PO has a dot shape, and the pixel connection opening CO has a slit shape.

Figure 8:
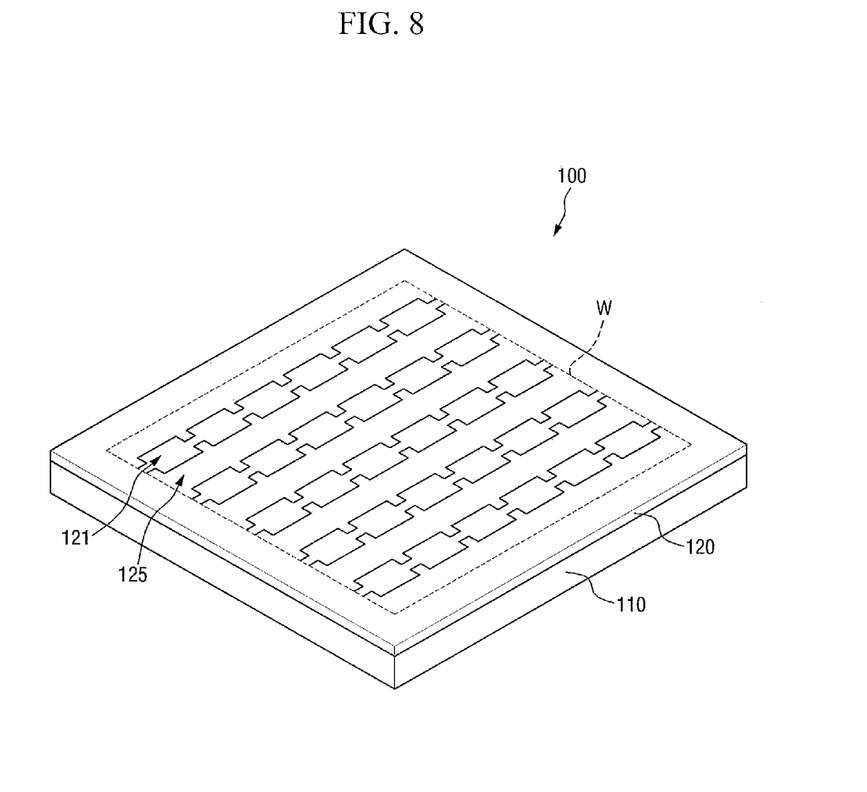

Referring to FIG. 8, the mask fixing step S20 may include a step of fixing the mask 120 onto a mask frame 110 including the window W defined therein. The mask 120 may be fixed by coupling the mask 120 to the mask frame 110 using a welding method such as a spot welding process or a laser welding process.

When the mask preparing step S10 and the mask fixing step S20 are performed, the mask assembly 100 which may be used in the deposition step of the method of fabricating an organic light emitting display device may be completed.

Figure 9:
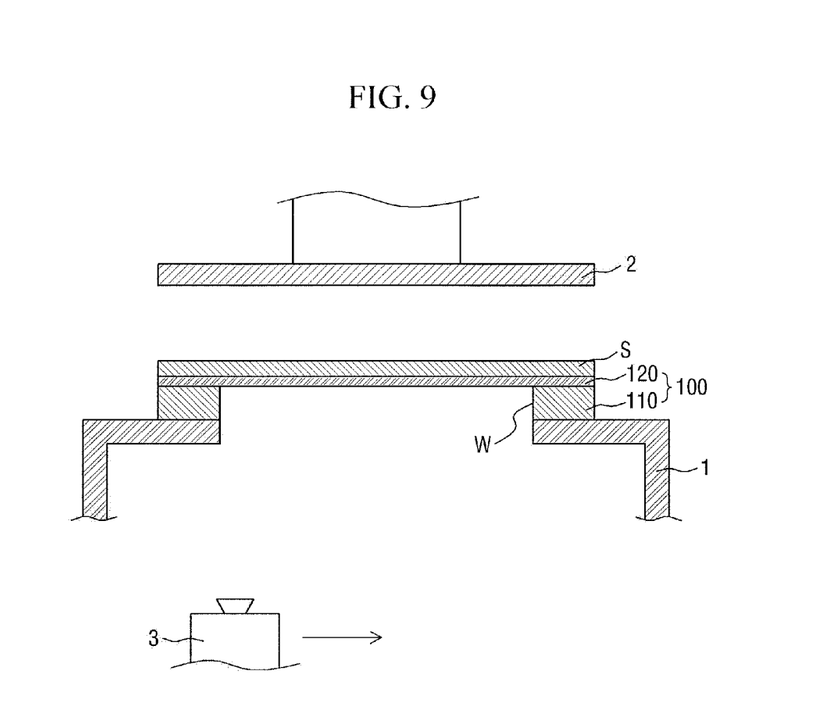
Figure 10:
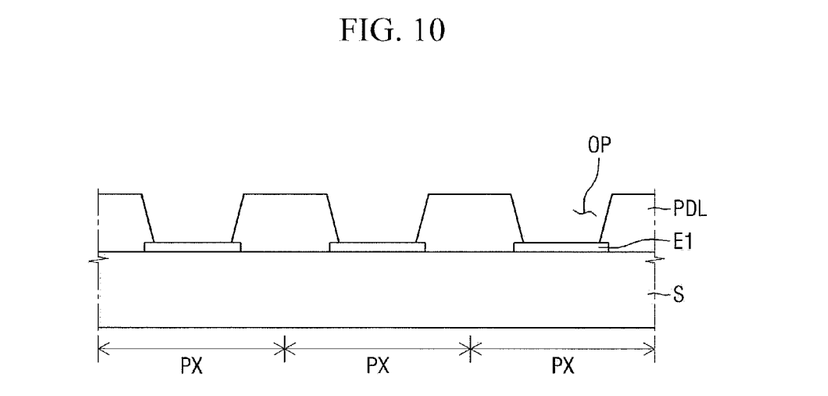

Referring to FIG. 9, the depositing step S30 may include a step of holding the substrate S on the mask 120 and depositing a deposition material onto the substrate S through the mask 120.

In the depositing step S30, the mask assembly 100 is first fixed in a frame support 1 in a space where the depositing process is to be performed. The substrate S may be disposed on the mask 120 by a transferring unit 2. The substrate S may be a substrate for an organic light emitting display device. That is, referring to FIG. 10, the substrate S may include a first electrode E1 which is formed on the substrate S for every pixel PX, and a pixel definition layer PDL having an open part OP may be formed on the substrate S to expose the first electrode E1. Here, when the substrate S is disposed on the mask 120, the pixel definition layer PDL is disposed to face the mask 120. Even though not illustrated, the substrate S may include a plurality of thin film transistors therein or thereon.

Next, in the depositing step S30, an organic deposition material may be deposited onto the first electrode E1 in the open part OP of the pixel definition layer (PDL of FIG. 10) through the mask 120 to form an organic light emitting layer. Here, the deposition material may be supplied onto the substrate S by depositing the deposition material along a direction intersecting an arrangement direction of the plurality of pixel connection openings CO in each open part 122 to 124 of the mask 120, for example, along the row direction intersecting the column direction. That is, the deposition material may be supplied onto the substrate S by moving the deposition supply source 3 which is disposed below the mask assembly 100 along the row direction of the mask 120.

By way of summation and review, some masks may be slit-type masks in which a slit-type opening is formed on a metal plate or a dot-type mask in which a dot-type opening is formed.

However, regarding the slit-type mask, as a size of the organic light emitting display device is increased, the slit-type opening having a small width is elongated, so that ribs of the mask adhere together around the slit-type opening during the deposition process, which may cause an error in thin film deposition of the substrate. Therefore, a replacement interval of the mask may be shortened.

In a dot-type mask, even though the ribs of the mask may not adhere together, a deposition incident angle of the deposition material may vary due to a side wall of the dot-type opening part having a large width. This may cause a shadow phenomenon, which may occur when the deposition material is not sufficiently deposited at an edge of the thin film on the substrate. Accordingly, errors in thin film deposition on the substrate may occur.

Present embodiments are directed to a mask assembly which reduces or prevents errors in thin film deposition on a substrate and minimizes or prevents a replacement interval of a mask from being shortened is discussed herein.

Further, a method of fabricating an organic light emitting display device using a mask assembly which prevents an error in thin film deposition of a substrate from occurring while preventing a replacement interval of a mask from being shortened is disclosed herein.

Embodiments are directed to a mask assembly including: a mask frame including a window is defined therein; and a mask which is disposed on the window and fixed to the mask frame, wherein the mask includes a plurality of open parts and a plurality of blocked parts which extend in a column direction, each open part and each blocked part are alternately arranged in a row direction, each open part includes a plurality of pixel openings and a plurality of pixel connection openings which are alternately arranged in the column direction, and a maximum width of the pixel opening is larger than a maximum width of the pixel connection opening.

Embodiments are also directed to a method of fabricating an organic light emitting display device including: preparing a mask including a plurality of open parts and a plurality of blocked parts which extend in a column direction in which each open part and each blocked part are alternately arranged in a row direction, each open part includes a plurality of pixel openings and a plurality of pixel connection openings which are alternately arranged in the column direction, and a maximum width of the pixel opening is larger than a maximum width of the pixel connection opening; fixing the mask on the mask frame including the window defined therein; and holding a substrate on the mask and depositing a deposition material onto the substrate through the mask.

Embodiments may have at least the following effects:

A mask assembly according to some embodiments may include a mask in which a plurality of open parts including a plurality of pixel openings and a plurality of pixel connection openings are alternatively arranged in a column direction. The mask is formed so that, when an organic material is deposited onto a pixel of the substrate through the pixel opening thereby forming an organic light emitting layer, a path through which the organic material is deposited onto the pixel of the substrate corresponding to each pixel opening through the pixel connection opening may also be provided.

Therefore, according to the mask assembly of some embodiments, when the organic material is deposited onto the pixel of the substrate through each pixel opening to form the organic light emitting layer, a shadow phenomenon that may occur when the organic material is not sufficiently deposited at the edge of the organic light emitting layer may be prevented. Thus, errors in thin film deposition on a substrate may be reduced or prevented.

It will be appreciated that many variations and modifications can be made to the preferred embodiments without substantially departing from the principles of some embodiments. Therefore, the disclosed exemplary embodiments are used in a generic and descriptive sense only and not for purposes of limitation.

Example embodiments have been disclosed herein, and although specific terms are employed, they are used and are to be interpreted in a generic and descriptive sense only, and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A mask assembly, comprising:
a mask frame including a window; and
a mask on the window and fixed to the mask frame,
wherein:
the mask includes a plurality of open parts and a plurality of blocked parts, each extending in a column direction,
each open part and each blocked part are alternately arranged in a row direction, each open part includes a plurality of pixel openings and a plurality of pixel connection openings which are alternately arranged in the column direction, a maximum width of the pixel opening is larger than a maximum width of the pixel connection opening, and the plurality of pixel openings in each open part are arranged along the column direction to be spaced apart from each other along the column direction, each pixel connection opening being positioned in a space between two pixel openings spaced apart from each other.

2. The mask assembly as claimed in claim 1, wherein:

the plurality of open parts includes a first open part and a second open part, the second open part being at one side of the first open part, the pixel opening of the first open part and the pixel opening of the second open part are arranged in a first row, and the pixel connection opening of the first open part and the pixel connection opening of the second open part are arranged in a second row.

3. The mask assembly as claimed in claim 1, wherein the pixel openings that are adjacent to each other in the column direction are symmetric to each other with respect to the pixel connection opening between adjacent pixel openings.

4. The mask assembly as claimed in claim 1, wherein the pixel opening has a dot shape and the pixel connection opening has a slit shape.

5. The mask assembly as claimed in claim 1, wherein each pixel connection opening connects between two pixel openings adjacent to each other along the column direction.

6. The mask assembly as claimed in claim 1, wherein two pixel openings adjacent to each other along the column direction are connected to each other only via the pixel connection opening therebetween.

7. The mask assembly as claimed in claim 1, wherein each blocked part includes a plurality of first blocked regions and a plurality of second blocked regions which are alternately arranged in the column direction, and a first maximum width of each of the first blocked regions is smaller than a second maximum width of each of the second blocked regions.

8. The mask assembly as claimed in claim 7, wherein:

the plurality of blocked parts includes a first blocked part and a second blocked part, the second blocked part being at one side of the first blocked part, the first blocked regions of the first blocked part and the first blocked regions of the second blocked part are arranged in a first row, and the second blocked regions of the first blocked part and the second blocked regions of the second blocked part are arranged in a second row.

9. The mask assembly as claimed in claim 7, wherein:

the pixel opening and the first blocked regions are arranged in a first row, and the pixel connection opening and the second blocked regions are arranged in a second row.

10. A method of fabricating an organic light emitting display device, comprising:

preparing a mask including a plurality of open parts and a plurality of blocked parts which extend in a column direction, wherein:

each open part and each blocked part are alternately arranged in a row direction, each open part includes a plurality of pixel openings and a plurality of pixel connection openings alternately arranged in the column direction, and a maximum width of the pixel opening is larger than a maximum width of the pixel connection opening;

fixing the mask on a mask frame including a window; and holding a substrate on the mask and depositing a deposition material onto the substrate through the mask.

11. The method as claimed in claim 10, wherein the mask preparing step includes forming the mask such that:

the plurality of open parts includes a first open part and a second open part, the second open part being arranged at one side of the first open part, the pixel opening of the first open part and the pixel opening of the second open part are arranged in a first row, and the pixel connection opening of the first open part and the pixel connection opening of the second open part are arranged in a second row.

12. The method as claimed in claim 10, wherein the mask preparing step includes forming the mask such that:

the pixel openings that are adjacent to each other in the column direction are symmetric with each other with respect to the pixel connection opening between adjacent pixel openings.

13. The method as claimed in claim 10, wherein the mask preparing step includes forming the mask such that the pixel opening has a dot shape and the pixel connection opening has a slit shape.

14. The method as claimed in claim 10, wherein the depositing step includes preparing the substrate for the organic light emitting display device, wherein the substrate includes:

a first electrode formed on the substrate for every pixel, and a pixel definition layer including an open part on the substrate to expose the first electrode.

15. The method as claimed in claim 14, wherein the depositing step includes forming the organic light emitting layer by depositing an organic deposition material onto the first electrode in the open part of the pixel definition layer through the mask.

16. The method as claimed in claim 10, wherein the depositing step includes supplying the deposition material onto the substrate by depositing the deposition material along the row direction of the mask.

17. The method as claimed in claim 10, wherein the mask preparing step includes forming the mask such that:

each blocked part includes a plurality of first blocked regions and a plurality of second blocked regions alternately arranged in the column direction, and a first maximum width of each of the first blocked regions is smaller than a second maximum width of each of the second blocked regions.

18. The method as claimed in claim 17, wherein the mask preparing step includes forming the mask such that:

the plurality of blocked parts includes a first blocked part and a second blocked part, the second blocked part being at one side of the first blocked part, the first blocked regions of the first blocked part and the first blocked regions of the second blocked part are arranged in a first row, and the second blocked regions of the first blocked part and the second blocked regions of the second blocked part are arranged in a second row.

19. The method as claimed in claim 17, wherein the mask preparing step includes forming the mask such that:

the pixel opening and the first blocked regions are arranged in a first row, and the pixel connection opening and the second blocked regions are arranged in a second row.

* * * * *